(12) United States Patent
Suzuki et al.

(10) Patent No.: US 10,068,642 B1
(45) Date of Patent: Sep. 4, 2018

(54) MEMORY DEVICE AND CONTROL METHOD THEREOF

(71) Applicant: TOSHIBA MEMORY CORPORATION, Minato-ku, Tokyo (JP)

(72) Inventors: Kunifumi Suzuki, Yokkaichi Mie (JP); Kazuhiko Yamamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/696,118

(22) Filed: Sep. 5, 2017

(30) Foreign Application Priority Data

Mar. 24, 2017 (JP) .................................. 2017-058673

(51) Int. Cl.
| | |
|---|---|
| *G11C 11/00* | (2006.01) |
| *G11C 13/00* | (2006.01) |
| *H01L 45/00* | (2006.01) |
| *H01L 27/24* | (2006.01) |

(52) U.S. Cl.
CPC ...... *G11C 13/0007* (2013.01); *G11C 13/0097* (2013.01); *H01L 27/2463* (2013.01); *H01L 45/085* (2013.01); *H01L 45/1233* (2013.01); *H01L 45/1253* (2013.01); *H01L 45/146* (2013.01); *H01L 45/148* (2013.01); *H01L 45/1616* (2013.01)

(58) Field of Classification Search
CPC ............ G11C 13/0007; G11C 13/0097; H01L 27/2463; H01L 45/085; H01L 45/1233; H01L 45/1253; H01L 45/146; H01L 45/148; H01L 45/1616
USPC ....... 365/148, 46, 55, 74, 97, 100, 131, 158, 365/171, 173, 16
See application file for complete search history.

(56) References Cited

U.S. PATENT DOCUMENTS

| | | | |
|---|---|---|---|
| 7,639,523 B2 | 12/2009 | Celinska et al. | |
| 8,593,853 B2 | 11/2013 | Katoh | |
| 9,324,421 B2 | 4/2016 | Perner et al. | |
| 9,735,357 B2 * | 8/2017 | Jo ....................... | H01L 45/1233 |

* cited by examiner

*Primary Examiner* — Fernando Hidalgo
(74) *Attorney, Agent, or Firm* — Foley & Lardner LLP

(57) ABSTRACT

A memory device includes a control circuit configured to (i) start a first application of a first voltage between a first conductive layer and a third conductive layer, (ii) start a second application of the first voltage between a second conductive layer and the third conductive layer after a lapse of a first delay time since the start of the first application of the first voltage, and (iii) start an application of a second voltage, which is smaller than the first voltage, between the first conductive layer and the third conductive layer after a lapse of a second delay time since the start of the second application of the first voltage between the second conductive layer and the third conductive layer.

20 Claims, 8 Drawing Sheets

MEMORY DEVICE AND CONTROL METHOD THEREOF

CROSS-REFERENCE TO RELATED APPLICATION

This application claims the benefit of and priority to Japanese Patent Application No. 2017-058673, filed Mar. 24, 2017, the entire contents of which are incorporated herein by reference.

FIELD

Embodiments described herein relate generally to memory devices and control methods thereof.

BACKGROUND

Some resistance-change type memory devices cause a memory cell transition between a high-resistance state and a low-resistance state by applying a current to a variable resistance layer of the memory cell. For example, if the high-resistance state is defined as data "0" and the low-resistance state is defined as data "1", the memory cell is capable of storing 1-bit data of "0" or "1". Rewriting the data of the memory cell in a short time can help to achieve enhancement of the speed of the operation of the resistance-change type memory.

DETAILED DESCRIPTION

Figure 1:
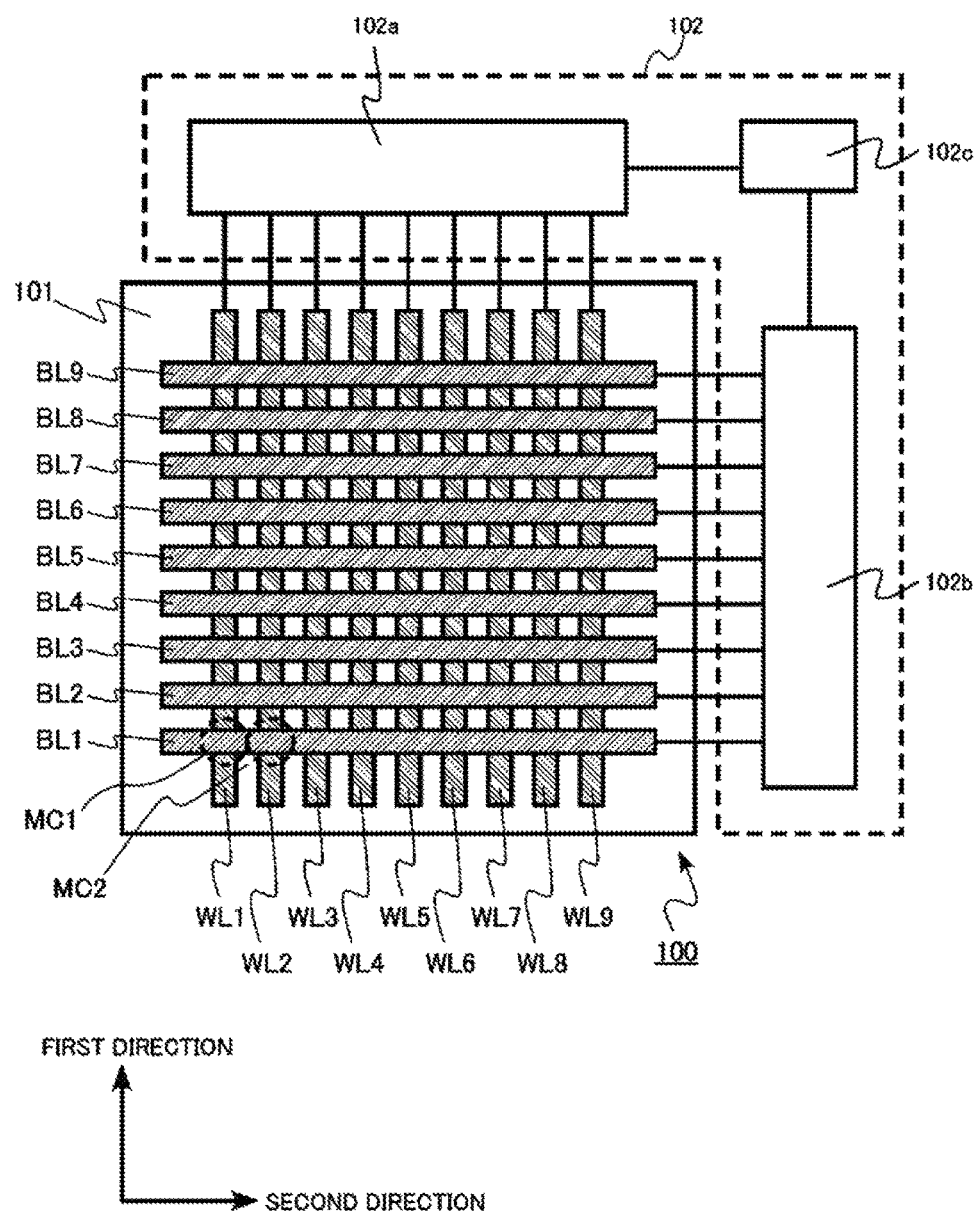
FIG. 1 is a block diagram showing one or more embodiments of a memory cell array and a peripheral circuit of a memory device according to a first aspect.

One or more example embodiments provide for a memory device that can enhance the speed of an operation.

In general, according to one or more embodiments, a memory device includes a first conductive layer that extends in a first direction, a second conductive layer that extends in the first direction, and a third conductive layer that extends in a second direction intersecting the first direction. The memory device further includes a first variable resistance layer that is provided between the first conductive layer and the third conductive layer and includes a first layer including a first semiconductor, a first semiconductor oxide, or a first metal oxide containing a first metal and a second layer including a second metal oxide containing a second metal different from the first metal. The memory device further includes a second variable resistance layer that is provided between the second conductive layer and the third conductive layer and includes a third layer including a second semiconductor, a second semiconductor oxide, or a third metal oxide containing a third metal and a fourth layer including a fourth metal oxide containing a fourth metal different from the third metal. The memory device yet further includes a control circuit that controls voltages which are applied to the first conductive layer, the second conductive layer, and the third conductive layer. The control circuit is configured to (i) start a first application of a first voltage between the first conductive layer and the third conductive layer, (ii) start a second application of the first voltage in a state in which the first voltage is applied between the first conductive layer and the third conductive layer between the second conductive layer and the third conductive layer after a lapse of a first delay time since the start of the application of the first voltage, and (iii) start an application of a second voltage, which is smaller than the first voltage, between the first conductive layer and the third conductive layer in a state in which the first voltage is applied between the second conductive layer and the third conductive layer after a lapse of a second delay time since the start of the application of the first voltage between the second conductive layer and the third conductive layer.

Hereinafter, one or more embodiments will be described with reference to the drawings. In at least some of the following description, the same or similar components, for example, will be identified with the same reference characters, and redundant description thereof will be omitted as appropriate.

Hereinafter, memory devices of one or more embodiments will be described with reference to the drawings.

First Aspect

One or more embodiments of a control method of the memory device according to the first aspect is a control method of a memory device that includes a first conductive layer that extends in a first direction, a second conductive layer that extends in the first direction, a third conductive layer that extends in a second direction intersecting the first direction, a first variable resistance layer that is provided between the first conductive layer and the third conductive layer and includes a first layer including a first semiconductor, a first semiconductor oxide, or a first metal oxide containing a first metal and a second layer including a second metal oxide containing a second metal different from the first metal, and a second variable resistance layer that is provided between the second conductive layer and the third conductive layer and includes a third layer including a second semiconductor, and a second semiconductor oxide, or a third metal oxide containing a third metal and a fourth layer including a fourth metal oxide containing a fourth metal different from the third metal. The control method includes starting a first application of a first voltage between the first conductive layer and the third conductive layer, starting a second application of the first voltage between the second conductive layer and the third conductive layer in a state in which the first voltage is applied between the first conductive layer and the third conductive layer after a lapse of a first delay time since the start of the application of the first voltage, and starting an application of a second voltage, which is smaller than the first voltage, between the first conductive layer and the third conductive layer in a state in which the first voltage is applied between the second conductive layer and the third conductive layer after a lapse of a second delay time since the start of the application of the first voltage between the second conductive layer and the third conductive layer.

Figure 2A:
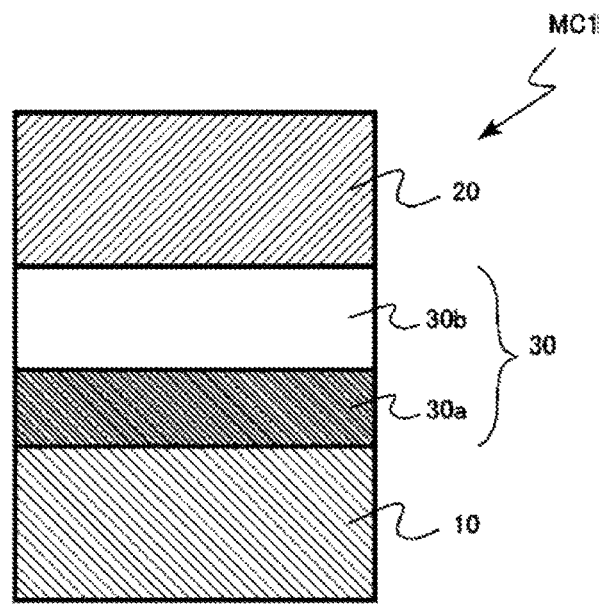
FIG. 2A and FIG. 2B are each a schematic sectional view of one or more embodiments of a memory cell of the memory device according to the first aspect.
Figure 2B:
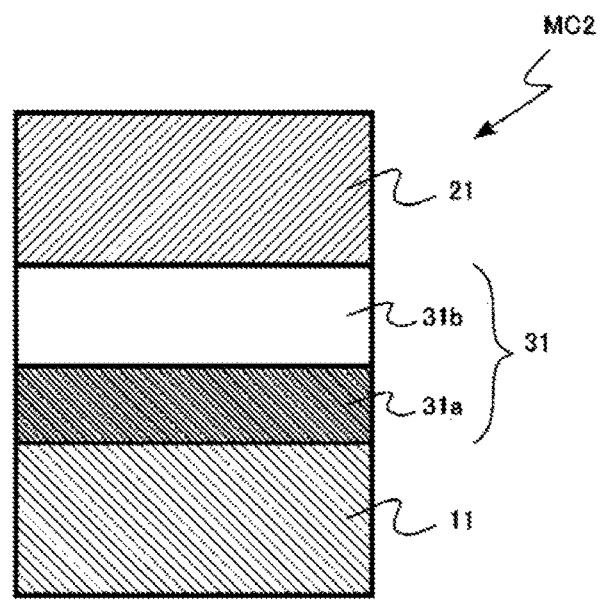

FIG. 1 is a block diagram of one or more embodiments of a memory cell array and a peripheral circuit of the memory device according to the first aspect. FIG. 2A and FIG. 2B are each a schematic sectional view of one or more embodiments of a memory cell of the memory device according to the first aspect. FIG. 2A depicts a cross section of one memory cell MC1 depicted in a circle indicated by a dotted line in the memory cell array shown in FIG. 1. FIG. 2B depicts a cross section of one memory cell MC2 depicted in a circle indicated by a dotted line in the memory cell array shown in FIG. 1.

A memory cell array 100 of one or more embodiments of the memory device according to the first aspect includes a plurality of word lines WL1, WL2, WL3, WL4, WL5, WL6, WL7, WL8, and WL9 (WL1 to WL9) extending in a first direction and a plurality of bit lines BL1, BL2, BL3, BL4, BL5, BL6, BL7, BL8, and BL9 (BL1 to BL9) extending in a second direction intersecting the first direction (e.g. a second direction orthogonal to the first direction). The plurality of word lines WL1 to WL9 and the plurality of bit lines BL1 to BL9 intersect at approximately right angles, for example (e.g. each of the word lines WL1 to WL9 intersects at least one of the bit lines BL1 through BL9 at an approximately 90 degree angle, at an approximately 89 degree angle, at an approximately 88 degree angle, at an approximately 87 degree angle, at an approximately 86 degree angle, or at an approximately 85 degree angle).

The plurality of word lines WL1 to WL9 and the plurality of bit lines BL1 to BL9 are provided, for example, on a semiconductor substrate 101 with an insulating layer placed therebetween. The bit lines BL1 to BL9 are provided in a layer above the word lines WL1 to WL9, for instance.

Around the memory cell array 100, a peripheral circuit 102 (a control circuit) is provided. The peripheral circuit 102 includes, for example, a word line control circuit 102a, a bit line control circuit 102b, and a central control circuit 102c. The peripheral circuit 102 does not necessarily have to be disposed around the memory cell array 100. For instance, part of the peripheral circuit 102 may be disposed above or below the memory cell array 100. Alternatively, the whole of the peripheral circuit 102 may be disposed above or below the memory cell array 100.

In regions in which the word lines WL1 to WL9 and the bit lines BL1 to BL9 intersect, a plurality of memory cells are provided. One or more embodiments of the memory device according to the first aspect is a resistance-change type memory with a crosspoint structure. One or more embodiments of the memory device according to the first aspect has a two-dimensional structure. The memory cell is a two-terminal resistance variable element. One or more embodiments of the memory device according to the first aspect is a vacancy-modulated conductive oxide (VMCO) memory that implements a vacancy-modulated conductive oxide in a variable resistance layer.

The plurality of word lines WL1 to WL9 are electrically connected to the word line control circuit 102a. Moreover, the plurality of bit lines BL1 to BL9 are electrically connected to the bit line control circuit 102b. The central control circuit 102c is electrically connected to the word line control circuit 102a and the bit line control circuit 102b.

The word line control circuit 102a and the bit line control circuit 102b are configured to, for example, select an intended memory cell and perform writing of data to the memory cell, reading of data from the memory cell, erasing of data of the memory cell, and so forth. At the time of reading of data, the data of the memory cell determined based on the amount of the current that flows between the word lines WL1 to WL9 and the bit lines BL1 to BL9. For instance, the central control circuit 102c is configured to determine the polarity of data by determining the amount of the current. For example, the central control circuit 102c determines whether the data is "0" or "1".

The word line control circuit 102a, the bit line control circuit 102b, and the central control circuit 102c are configured with an electronic circuit using a semiconductor device which is formed on the semiconductor substrate 101, for example. The semiconductor device is, for instance, a transistor, a diode, or a capacitor.

As depicted in FIG. 2A, the memory cell MC1 includes a lower electrode 10, an upper electrode 20, and a variable resistance layer 30 (a first variable resistance layer).

The lower electrode 10 is, for example, part of the word line WL1 (a first conductive layer). The lower electrode 10 includes, for example, a metal. The lower electrode 10 includes titanium nitride (TiN) or tungsten (W), for example.

The upper electrode 20 is, for example, part of the bit line BL1 (a third conductive layer). The upper electrode 20 includes, for example, a metal. The upper electrode 20 includes titanium nitride (or tungsten, for example.

The variable resistance layer 30 is sandwiched between the lower electrode 10 and the upper electrode 20. The variable resistance layer 30 is provided between the word line WL1 (the first conductive layer) and the bit line BL1 (the third conductive layer). The variable resistance layer 30 includes a high-resistance layer 30a (a first layer) and a low-resistance layer 30b (a second layer).

The film thickness of the variable resistance layer 30 is, for example, about 5 nm or more, and/or about 25 nm or less. The variable resistance layer 30 is a film formed by atomic layer deposition (ALD), for instance.

The high-resistance layer 30a includes a first semiconductor, a first semiconductor oxide, or a first metal oxide including a first metal. The high-resistance layer 30a is, for example, an amorphous semiconductor, an amorphous semiconductor oxide, or an amorphous metal oxide.

The high-resistance layer 30a is, for example, the first semiconductor, or is the first semiconductor oxide. The high-resistance layer 30a includes silicon or germanium, for instance. The high-resistance layer 30a is, for example, an amorphous silicon.

The high-resistance layer 30a includes, for example, the first metal oxide including the first metal. The first metal is, for instance, at least one element selected from the group consisting of aluminum (Al), hafnium (Hf), and zirconium (Zr). The high-resistance layer 30a is an aluminum oxide, a hafnium oxide, or a zirconium oxide, for example.

The film thickness of the high-resistance layer 30a is, for example, about 2 nm or more, and/or about 10 nm or less.

The low-resistance layer 30b includes a second metal oxide containing a second metal different from the first metal. The second metal is, for example, at least one element selected from the group consisting of titanium (Ti), niobium (Nb), tantalum (Ta), and tungsten. The low-resistance layer 30b includes, for instance, a titanium oxide, a niobium oxide, a tantalum oxide, or a tungsten oxide. The low-resistance layer 30b includes, for example, the at least one element described above (e.g. is about 50% or more, by atomic weight, the at least one element described above).

The resistivity of the low-resistance layer 30b is lower than the resistivity of the high-resistance layer 30a. At least part of the low-resistance layer 30b is a crystalline substance. As a result of the metal oxide of the low-resistance layer 30b being crystallized, the resistivity is low.

The film thickness of the low-resistance layer 30b is, for example, about 3 nm or more, and/or about 15 nm or less.

As depicted in FIG. 2B, the memory cell MC2 includes a lower electrode 11, an upper electrode 21, and a variable resistance layer 31 (a second variable resistance layer).

The lower electrode 11 is, for example, part of the word line WL2. The upper electrode 21 is, for example, part of the bit line BL1.

The variable resistance layer 31 is sandwiched between the lower electrode 11 and the upper electrode 21. The variable resistance layer 31 is provided between the word line WL2 (a second conductive layer) and the bit line BL1 (the third conductive layer). The variable resistance layer 31 includes a high-resistance layer 31a (a third layer) and a low-resistance layer 31b (a fourth layer).

The lower electrode 11, the upper electrode 21, the variable resistance layer 31, the high-resistance layer 31a, and the low-resistance layer 31b have respectively include similar materials and have similar structures as the lower electrode 10, the upper electrode 20, the variable resistance layer 30, the high-resistance layer 30a, and the low-resistance layer 30b. A second semiconductor of the high-resistance layer 31a corresponds to the first semiconductor of the high-resistance layer 30a. A third metal of the high-resistance layer 31a corresponds to the first metal of the high-resistance layer 30a. A fourth metal of the low-resistance layer 31b corresponds to the second metal of the low-resistance layer 30b.

The variable resistance layer 30 and the variable resistance layer 31 may be continuous layers.

By applying a current to the variable resistance layer 30 of the memory cell MC1, the variable resistance layer 30 changes from a high-resistance state to a low-resistance state or from the low-resistance state to the high-resistance state. For example, the high-resistance state is defined as data "0" and the low-resistance state is defined as data "1". The memory cell MC1 is capable of storing 1-bit data of "0" or "1". A change from the high-resistance state to the low-resistance state is referred to as a set operation, and a change from the low-resistance state to the high-resistance state is referred to as a reset operation. By the set operation and the reset operation, the data of the memory cell is rewritten.

By the application of a current to the variable resistance layer 30, the amount of oxygen vacancy and/or the oxygen vacancy distribution in the low-resistance layer 30b changes. With a change in the amount of oxygen vacancy or the oxygen vacancy distribution in the low-resistance layer 30b, the conductivity of the variable resistance layer 30 changes. The low-resistance layer 30b is a so-called vacancy-modulated conductive oxide.

In one or more embodiments of the VMCO memory using a vacancy-modulated conductive oxide according to the first aspect, the application of a higher voltage or a longer application of a voltage is implemented for the reset operation as compared to the set operation.

Next, the function of the peripheral circuit 102 and a control method using the peripheral circuit 102 will be described.

Figure 3:
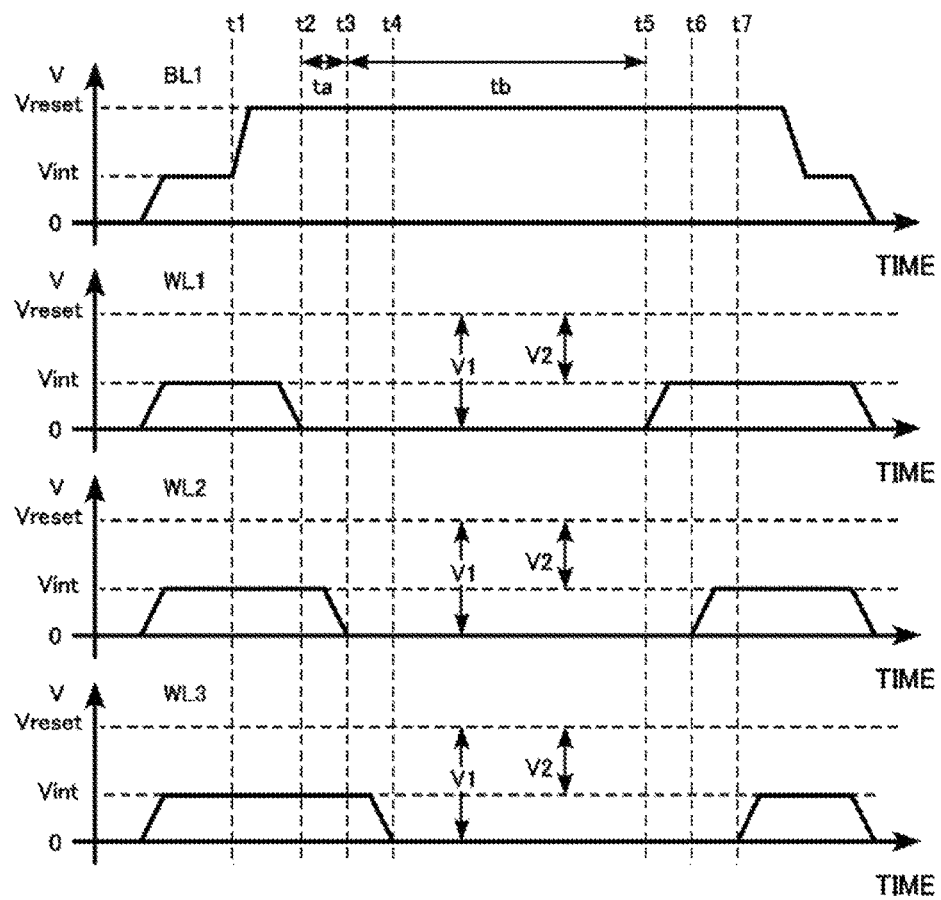
FIG. 3 is an explanatory diagram of one or more embodiments of a control method of the memory device according to the first aspect.

FIG. 3 is an explanatory diagram of one or more embodiments of a control method of the memory device according to the first aspect. FIG. 3 is a timing chart of voltages which are applied to the bit line BL1, the word line WL1, the word line WL2, and the word line WL3.

FIG. 3 is a timing chart of the reset operation of the memory cell MC1 between the word line WL1 and the bit line BL1, the memory cell MC2 between the word line WL2 and the bit line BL1, and a memory cell MC3 between the word line WL3 and the bit line BL1. FIG. 3 depicts, from top to bottom, a voltage which is applied to the bit line BL1, a voltage which is applied to the word line WL1, a voltage which is applied to the word line WL2, and a voltage which is applied to the word line WL3.

FIG. 3 depicts a case in which the reset operation is continuously performed on the memory cells MC1, MC2, and MC3 which are provided between one bit line BL1 and the three word lines WL1, WL2, and WL3, respectively, which intersect the bit line BL1.

At the time of operation of the memory device, a first low-level voltage, a first high-level voltage, and a first intermediate voltage, for example, are applied to the bit line BL1. The first intermediate voltage is a voltage at an intermediate level between the first high-level voltage and the first low-level voltage. Moreover, a second low-level voltage, a second high-level voltage, and a second intermediate voltage, for example, are applied to the word lines WL1, WL2, and WL3. The second intermediate voltage is a voltage at an intermediate level between the second high-level voltage and the second low-level voltage.

Description will be given using the memory cell MC1 as an example. At the time of the reset operation of the memory cell MC1, a reset voltage is applied between the word line WL1 and the bit line BL1. The reset voltage is, for example, a difference between the first high-level voltage of the bit line BL1 and the second low-level voltage of the word line WL1.

At the time of the set operation of the memory cell MC1, a set voltage is applied between the word line WL1 and the bit line BL1. The set voltage is, for example, a difference between the first low-level voltage of the bit line BL1 and the second high-level voltage of the word line WL1. To the memory cell MC1, a voltage whose polarity is opposite to that of a voltage which is applied at the time of the reset operation is applied. One or more embodiments of the memory device according to the first aspect is a bipolar device in which voltages of different polarities are applied at the time of the set operation and at the time of the reset operation.

When the memory cell MC1 is not selected, that is, when neither the reset operation nor the set operation are being performed, any of a difference between the first high-level voltage of the bit line BL1 and the second intermediate voltage of the word line WL1, a difference between the first low-level voltage of the bit line BL1 and the second intermediate voltage of the word line WL1, and a difference between the first intermediate voltage of the bit line BL1 and the second intermediate voltage of the word line WL1 can be applied.

Hereinafter, to simplify the description, the first low-level voltage and the second low-level voltage are assumed to be 0 (zero) volts (V). However, in one or more embodiments the first low-level voltage and the second low-level voltage can differ from each other. Moreover, the first intermediate voltage and the second intermediate voltage are assumed to be equal and will be referred to simply as an intermediate voltage. However, in one or more embodiments the first intermediate voltage and the second intermediate voltage can differ from each other. In the following description, the reset voltage which is a difference between the first high-level voltage of the bit line BL1 and the second low-level voltage of the word line WL1 is equal to the first high-level voltage of the bit line BL1, under the above-mentioned assumption that the second low-level voltage of the word line WL1 is zero V.

At first, the intermediate voltage (Vint) is applied to the bit line BL1, the word line WL1, the word line WL2, and the word line WL3. The intermediate voltage (Vint) is, for example, a voltage between the reset voltage (Vreset) and 0 V. The reset voltage is, for instance, about 3 V or more, and/or about 8 V or less, and the intermediate voltage is, for instance, about 1.5 V or more, and/or about 4 V or less.

Next, the reset voltage is applied to the bit line BL1 at time t1.

Then, the voltage of the word line WL1 is set at 0 V at time t2. At time t2, a first voltage (V1) is applied between the word line WL1 and the bit line BL1. The first voltage coincides with the reset voltage at this time. The reset operation of the memory cell MC1 starts at time t2.

Next, the voltage of the word line WL2 is set to 0 V at time t3. The time between time t2 and time t3 is a first delay time ta. The first delay time ta is, for example, about 100 nanoseconds or more, and/or about 5 microseconds or less.

At time t3, the first voltage (V1) is applied between the word line WL2 and the bit line BL1. The reset operation of the memory cell MC2 starts at time t3.

After a lapse of the first delay time ta since the start of the application of the first voltage between the word line WL1 and the bit line BL1, the first voltage is applied between the word line WL2 and the bit line BL1 in a state in which the first voltage is applied between the word line WL1 and the bit line BL1. That is, the reset operation of the memory cell MC2 starts at time t3 in a state in which the reset operation of the memory cell MC1 is being performed.

Next, the voltage of the word line WL3 is set at 0 V at time t4.

At time t4, the reset voltage (e.g. the first voltage (V1)) is applied between the word line WL3 and the bit line BL1. The reset operation of the memory cell MC3 starts at time t4.

The reset voltage is applied between the word line WL3 and the bit line BL1 in a state in which the reset voltage is applied between the word line WL1 and the bit line BL1 and the reset voltage is applied between the word line WL2 and the bit line BL1. That is, the reset operation of the memory cell MC3 starts at time t4 in a state in which the reset operations of the memory cell MC1 and the memory cell MC2 are being performed.

Next, the voltage of the word line WL1 is set at the intermediate voltage at time t5. The time between time t3 and time t5 is a second delay time tb.

At time t5, a second voltage (V2) is applied between the word line WL1 and the bit line BL1. The second voltage coincides with a difference between the reset voltage and the intermediate voltage. The reset operation of the memory cell MC1 ends at time t5.

The sum of the first delay time ta and the second delay time tb is the reset operation time of the memory cell MC1. The sum of the first delay time ta and the second delay time tb is a duration that is about ten times as long, or more, than the first delay time, for example. The sum of the first delay time ta and the second delay time tb is, for example, about 10 microseconds or more, and/or about 200 microseconds or less.

The second voltage is applied between the word line WL1 and the bit line BL1 in a state in which the reset voltage is applied between the word line WL2 and the bit line BL1 and the reset voltage is applied between the word line WL3 and the bit line BL1. That is, the reset operation of the memory cell MC1 ends at time t5 in a state in which the reset operations of the memory cell MC2 and the memory cell MC3 are being performed.

Next, the voltage of the word line WL2 is set at the intermediate voltage at time t6. The reset operation of the memory cell MC2 ends at time t6 in a state in which the reset operation of the memory cell MC3 is being performed.

Then, the voltage of the word line WL3 is set at the intermediate voltage at time t7. The reset operation of the memory cell MC3 ends at time t7.

The peripheral circuit 102 is configured to perform the above-described reset operations. The reset operations described above are controlled by using the peripheral circuit 102.

Hereinafter, the workings and effects of one or more embodiments according to the first aspect will be described.

In some implementations it may be desirable to rewrite data of a plurality of memory cells collectively performed (e.g. concurrently performed) in order to enhance the speed of the memory device. However, if operations to rewrite data of a plurality of memory cells are collectively performed, the amount of the current required for the rewriting operation is increased. If the amount of the current is increased, for example, the current may reach the limit of a drive current of the peripheral circuit 102, making rewriting of data challenging.

In the VMCO memory, the application of a higher voltage or a longer application of a voltage may be used at the time of the reset operation to rewrite the low-resistance state to the high-resistance state, as compared to the set operation to rewrite the high-resistance state to the low-resistance state. Thus, performing the reset operation of a plurality of memory cells at high speed can be challenging.

Figure 4A:
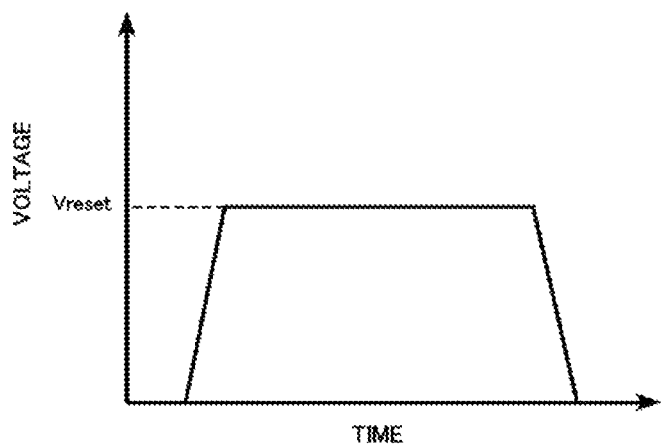
FIG. 4A and FIG. 4B are explanatory diagrams of workings and effects of one or more embodiments of the memory device according to the first aspect.
Figure 4B:
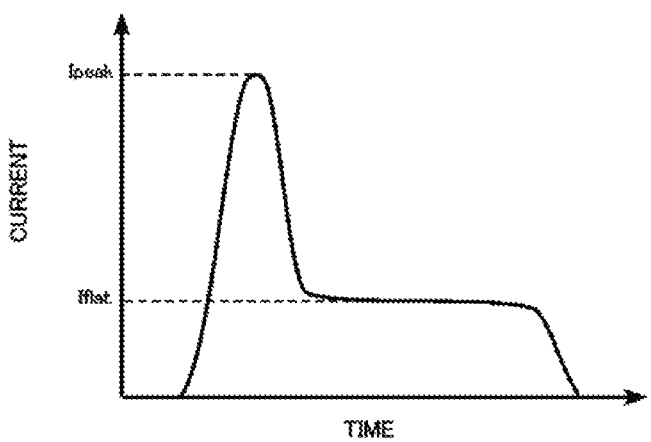

FIG. 4A and FIG. 4B are diagrams explaining the workings and effects of one or more embodiments of the memory device according to the first aspect. FIG. 4A depicts a voltage waveform which is applied to a memory cell of the VMCO memory at the time of the reset operation. FIG. 4B depicts a current waveform which flows through the memory cell at the time of application of the voltage shown in FIG. 4A.

As depicted in FIG. 4A, the reset voltage is applied to the memory cell as a trapezoidal voltage pulse. In this case, as depicted in FIG. 4B, a large initial current having a peak form starts to flow immediately after the start of the application of the voltage. The peak of this current is referred to as a peak current (Ipeak). Moreover, a lower and stable current that may flow after the initial flow of the large current is referred to as a flat current (Iflat). The flat current need not be perfectly constant.

In less than about 2 microseconds (e.g. in less than about 1.9 microsecond, in less that about 1.8 microseconds, or in less than about 1.7 microseconds), for example, after the start of the application of the voltage, the current value is substantially stabilized at a low value (Iflat). The value of the peak current (Ipeak) is, for example, equal to about ten times or more than the value of the flat current (Iflat).

Figure 5A:
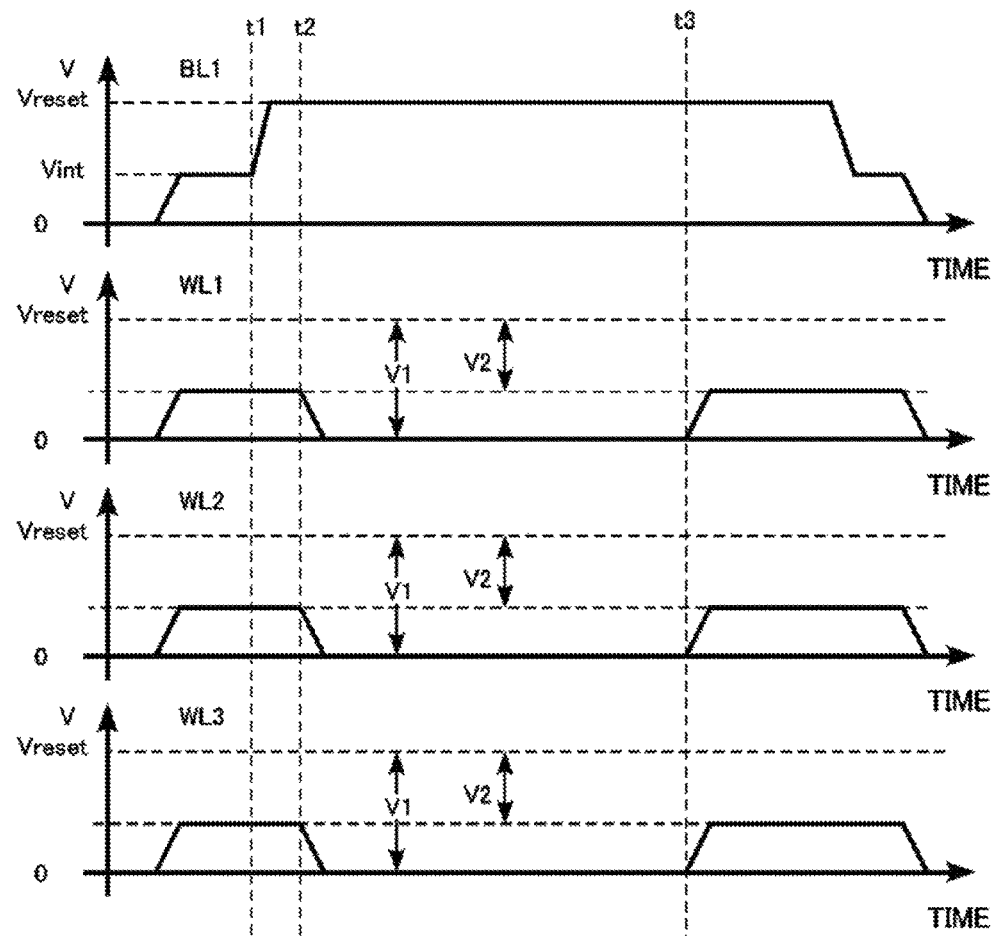
FIG. 5A and FIG. 5B are explanatory diagrams of workings and effects of a comparative memory device.
Figure 5B:
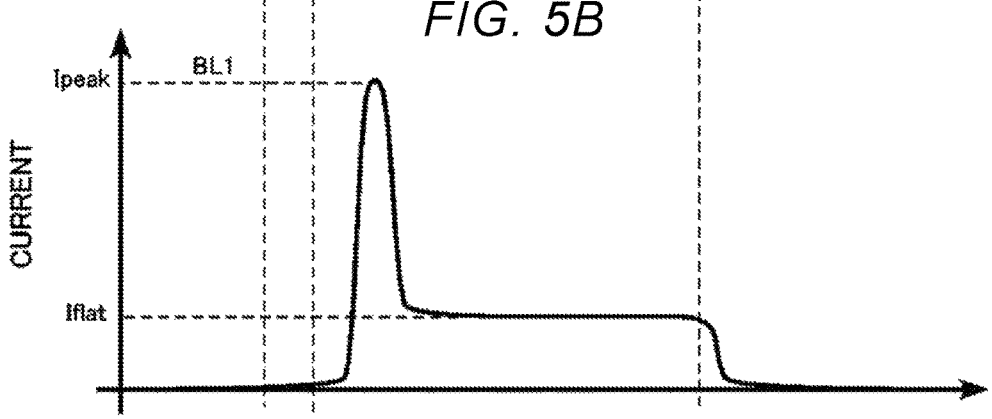

FIG. 5A and FIG. 5B are diagrams explaining the workings and effects of one or more embodiments of the memory device according to the first aspect. FIG. 5A and FIG. 5B are explanatory diagrams of a control method of a comparative memory device. FIG. 5A is a timing chart of voltages which are applied to the bit line BL1, the word line WL1, the word line WL2, and the word line WL3. FIG. 5B is a diagram depicting a current waveform which flows through the bit line BL1.

The control method of the comparative memory device collectively (e.g. simultaneously) performs the reset operation on the memory cells MC1, MC2, and MC3 which are provided between one bit line BL1 and the three word lines WL1, WL2, and WL3, respectively, which intersect the bit line BL1.

At first, the intermediate voltage (Vint) is applied to the bit line BL1, the word line WL1, the word line WL2, and the word line WL3.

Next, at time t1, the reset voltage is applied to the bit line BL1.

Then, at time t2, the voltages of the word line WL1, the word line WL2, and the word line WL3 are collectively set at 0 V. At time t2, the reset voltage is applied between the word line WL1 and the bit line BL1, between the word line WL2 and the bit line BL1, and between the word line WL3 and the bit line BL1 at the same time.

At time t2, the reset operations of the memory cell MC1, the memory cell MC2, and the memory cell MC3 start at the same time.

At time t3, the voltages of the word line WL1, the word line WL2, and the word line WL3 are collectively set at the intermediate voltage. The reset operations of the memory cell MC1, the memory cell MC2, and the memory cell MC3 end at time t3 at the same time.

As depicted in FIG. 5B, a large peak current flows immediately after the collective start of the reset operations of the memory cell MC1, the memory cell MC2, and the memory cell MC3. This is caused by the characteristics of a current flowing through one memory cell, described above in reference to FIG. 4A and FIG. 4B.

When a plurality of memory cells are collectively made to perform the reset operation, a very large peak current flows because the peak currents of the plurality of memory cells are added together.

Figure 6A:
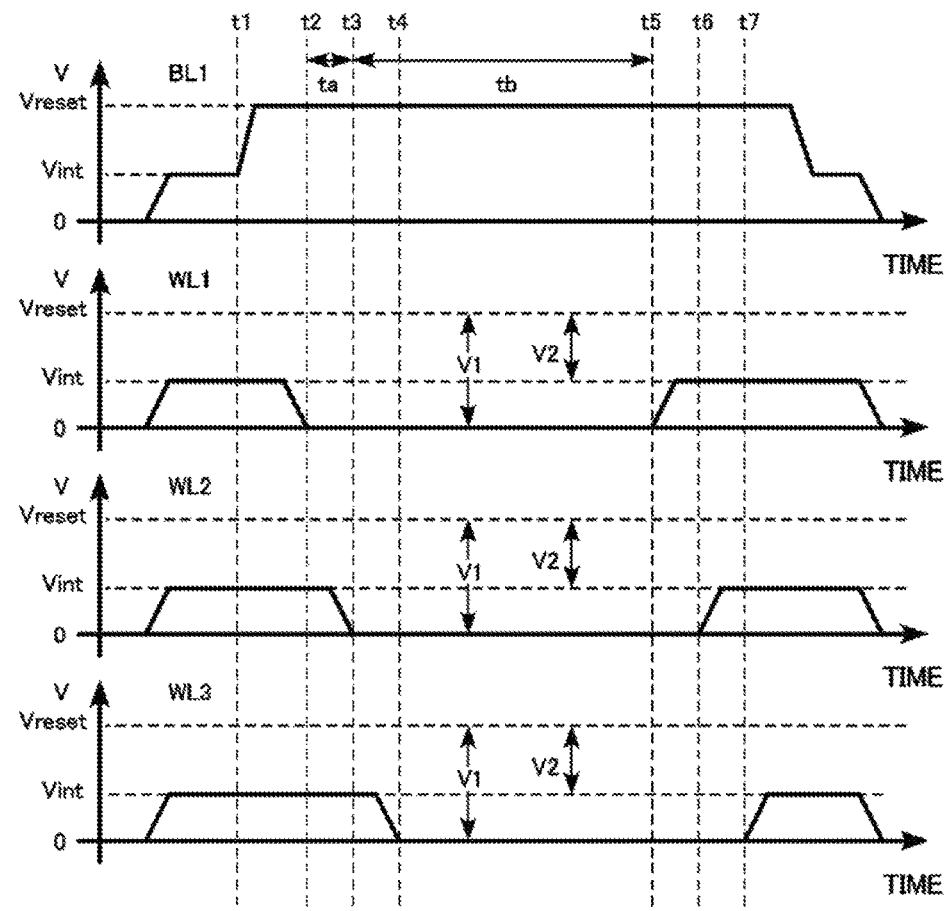
FIG. 6A and FIG. 6B are explanatory diagrams of workings and effects of one or more embodiments of the memory device according to the first aspect.
Figure 6B:
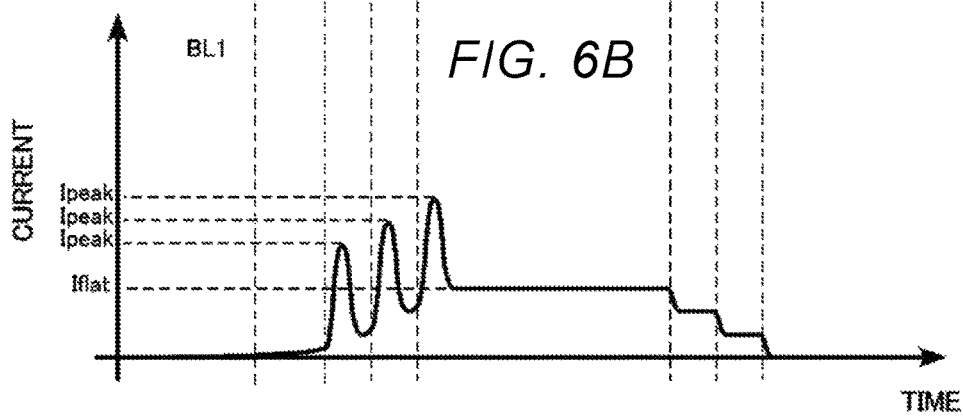

FIG. 6A and FIG. 6B are diagrams explaining the workings and effects of one or more embodiments of the memory device according to the first aspect. FIG. 6A and FIG. 6B are explanatory diagrams of one or more embodiments of the control method of the memory device according to the first aspect. The timing chart shown in FIG. 6A is similar to the timing chart shown in FIG. 3. FIG. 6B is a diagram depicting a current waveform which flows through the bit line BL1.

In one or more embodiments according to the first aspect, as depicted in FIG. 6A, the reset operations of the memory cell MC1, the memory cell MC2, and the memory cell MC3 are started by shifting the times at which the reset operations are started (e.g. by the first delay time ta). As a result, as depicted in FIG. 6B, a peak current is divided into three peaks. Thus, the magnitude of the peak current for each peak is smaller than the magnitude of the peak current for the peak of the comparative example shown in FIG. 5B. In other words, the maximum amount of the current that flows through the bit line BL1 is reduced.

In order to curb a current at the time of the reset operations of a plurality of memory cells, performing reset operation on the plurality of memory cells one at a time is possible. However, in this case, a long time is required for the reset operation and enhancement of the speed of the memory device may be challenging.

In one or more embodiments according to the first aspect, by shifting the start times of the reset operations, the peak current at the time of the reset operation is curbed, whereby the reset operations of a plurality of memory cells can be concurrently performed. Therefore, enhancement of the speed of the memory device can be achieved.

In one or more embodiments, the first delay time ta, that is, the time from the start of the reset operation of the memory cell MC1 to the start of the reset operation of the memory cell MC2 is about 100 nanoseconds or more, and/or about 5 microseconds or less. If the first delay time ta falls below the above range, there is a possibility that the peak current of the memory cell MC1 and the peak current of the memory cell MC2 overlap one another, which can result in an increase in the peak current at the time of the reset operation. Moreover, if the first delay time ta exceeds the above range, there is a possibility that the time required for the reset operations of the memory cell MC1 and the memory cell MC2 becomes too long, which can inhibit enhancement of the speed of the memory device.

In one or more embodiments, the sum of the first delay time ta and the second delay time tb, that is, the reset operation time of the memory cell MC1 is about 10 microseconds or more, and/or about 200 microseconds or less. Furthermore, the sum of the first delay time ta and the second delay time tb is a duration that is about ten times as long, or more, than the first delay time ta. If the sum of the first delay time ta and the second delay time tb falls below the above range, there is a possibility that sufficient rewriting of data will not be performed. Moreover, if the sum of the first delay time ta and the second delay time tb exceeds the above range, there is a possibility that the time required for the reset operation becomes too long, which can inhibit enhancement of the speed of the memory device.

In one or more embodiments, the first voltage (V1) and the second voltage (V2) are the same in polarity and the second voltage (V2) is greater in magnitude than about half of the magnitude of the first voltage (V1). In other words, a difference between the reset voltage and the intermediate voltage of the word line WL1 is greater than the intermediate voltage of the word line WL1.

With the above configuration, a voltage which is applied to a non-selected memory cell when the polarity thereof is the same as the polarity of a voltage in the set operation is smaller than a voltage which is applied to a non-selected memory cell when the polarity thereof is the same as the polarity of a voltage in the reset operation. In one or more embodiments, the set voltage for the set operation is lower than the reset voltage for the reset operation. Therefore, with the configuration described above, a memory cell is prevented from being erroneously rewritten.

As described above, according to the first aspect, by concurrently performing the reset operation on a plurality of memory cells, enhancement of the speed of the memory device can be achieved. By staggering the start times of concurrently performed reset operations, enhancement of the speed of the memory device can be achieved.

Second Aspect

One or more embodiments of a memory device according to the second aspect differ from one or more embodiments according to the first aspect in that a control circuit is configured to control a first delay time based on the amount of the current which flows through a third conductive layer. Moreover, one or more embodiments of a control method according to the second aspect differ from one or more embodiments according to the first aspect in that the control method controls the first delay time based on the amount of the current which flows through the third conductive layer.

Hereinafter, redundant description already provided above in reference to the first aspect will be omitted.

Figure 7:
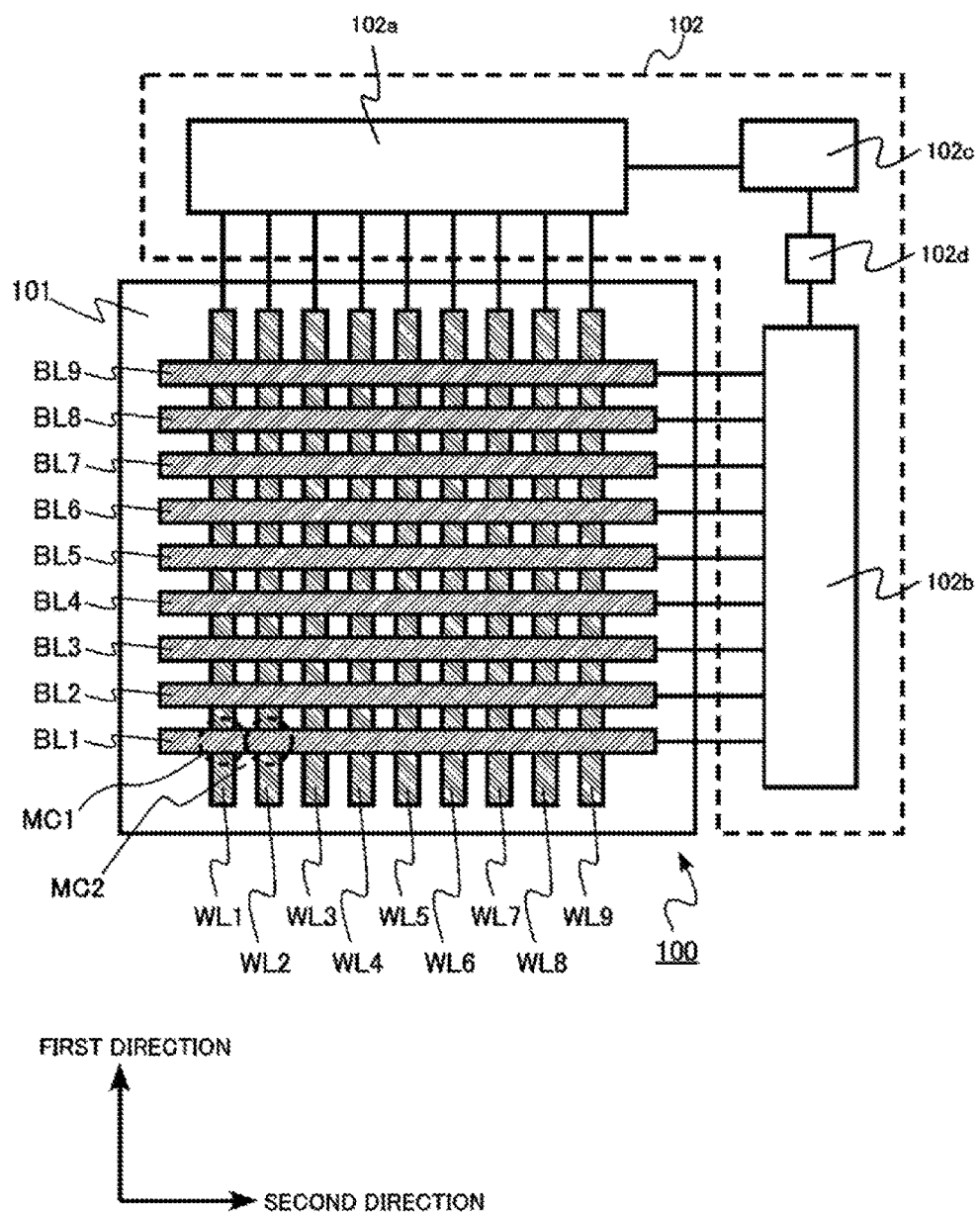
FIG. 7 is a block diagram of a memory cell array and a peripheral circuit of one or more embodiments of a memory device according to a second aspect.

FIG. 7 is a block diagram of a memory cell array and a peripheral circuit of one or more embodiments of the memory device according to the second aspect. A peripheral circuit 102 includes a delay time control circuit 102d.

The delay time control circuit 102d controls timing with which voltages are applied to the word lines WL1 to WL9 based on the amount of the current which flows through the bit lines BL1 to BL9.

Figure 8A:
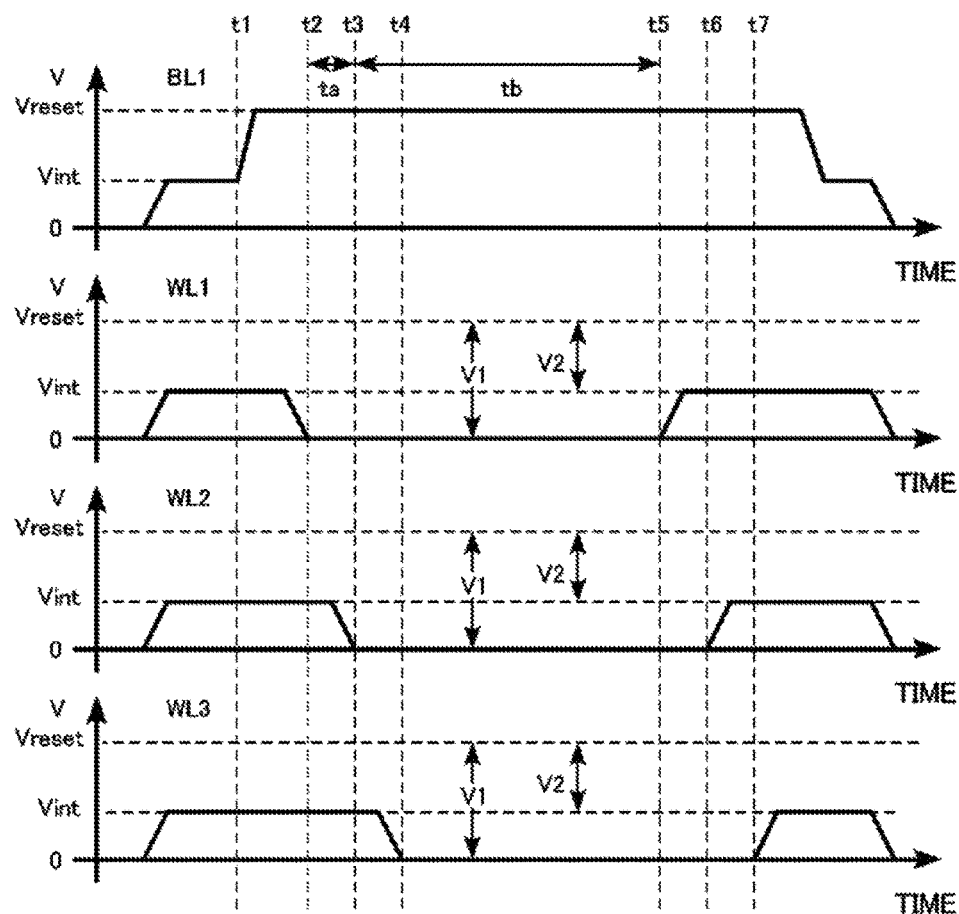
FIG. 8A and FIG. 8B are explanatory diagrams of workings and effects of one or more embodiments of the memory device according to the second aspect.
Figure 8B:
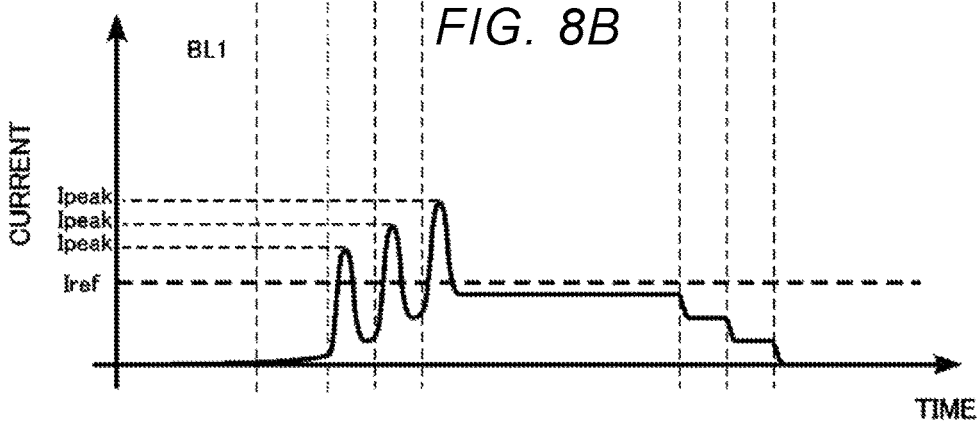

FIG. 8A and FIG. 8B are diagrams explaining the workings and effects of one or more embodiments of the memory device according to the second aspect. FIG. 8A and FIG. 8B are explanatory diagrams of one or more embodiments of the control method of the memory device according to the second aspect. A timing chart shown in FIG. 8A is similar to the timing charts shown in FIG. 3 and FIG. 6A. FIG. 8B is a diagram depicting a current waveform which flows through the bit line BL1.

The delay time control circuit 102d controls (e.g. sets or determines) the first delay time ta, that is, the time from the start of the reset operation of the memory cell MC1 to the start of the reset operation of the memory cell MC2 based on a current which flows through the bit line BL1. Specifically, for example, the delay time control circuit 102d monitors a current flowing through the bit line BL1 and, after time t2, when the current of the bit line BL1 is reduced from a high value (e.g. a maximum value) and reaches a predetermined reference current (Iref), the delay time control circuit 102d sets the word line WL2 of the memory cell MC2 to 0 V. As described above, the delay time control circuit 102d controls the first delay time ta so that the reset operation of the memory cell MC2 is started after the current flowing through the bit line BL1 exceeds a peak.

For instance, the delay time control circuit 102d is configured to compare the amount of the current which flows through the bit line BL1 with a predetermined reference value (corresponding to a magnitude of the reference current (Iref)). The predetermined reference value is a value smaller than the amount of a peak current which can flow through the memory cell MC1. The delay time control circuit 102d controls the first delay time ta based on the result of comparison.

By controlling the first delay time ta based on the current which flows through the bit line BL1, the time from the start of the reset operation of the memory cell MC1 to the start of the reset operation of the memory cell MC2 can be reduced, because, for example, providing a margin in the first delay time ta can be omitted.

As described above, in one or more embodiments according to the second aspect, as in one or more embodiments according to the first aspect, by concurrently performing the reset operation on a plurality of memory cells, enhancement of the speed of the memory device can be achieved. Furthermore, the time from the start of the reset operation of the memory cell MC1 to the start of the reset operation of the memory cell MC2 can be reduced, whereby a higher-speed memory device can be achieved.

According to the first and second aspects, the description deals with a case in which the memory cell array has a two-dimensional structure as an example, but the memory cell array can be configured so as to have a three-dimensional structure or other structure. By adopting a memory cell array with a three-dimensional structure, in addition to the effects of the first and second embodiments, the effect of increasing the degree of integration of the memory device can be obtained.

Application of a voltage V between a first component and a second component can include implementations in which a voltage substantially equal to the voltage V is applied between the first component and the second component. Starting an application of a voltage to a component can refer to electrically connecting the component to another component that is at the voltage.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments have been described, these embodiments have been presented by way of example only, and are not intended to limit the scope of the present disclosure. Indeed, the embodiments described herein may be embodied in a variety of other forms and can be combined; furthermore, various omissions, substitutions and changes in the form of the embodiments described herein may be made without departing from the spirit of the present disclosure. For example, a constituent element of one embodiment may be replaced with that of another embodiment or modified. The accompanying claims and their equivalents are intended to cover such forms or modifications as would fall within the scope and spirit of the present disclosure.

What is claimed is:

1. A memory device comprising:
   a first conductive layer that extends in a first direction;
   a second conductive layer that extends in the first direction;
   a third conductive layer that extends in a second direction intersecting the first direction;
   a first variable resistance layer that is provided between the first conductive layer and the third conductive layer and comprises a first layer comprising a first semiconductor, a first semiconductor oxide, or a first metal oxide comprising a first metal, and a second layer comprising a second metal oxide comprising a second metal different from the first metal;
   a second variable resistance layer that is provided between the second conductive layer and the third conductive layer and comprises a third layer comprising a second semiconductor, a second semiconductor oxide, or a third metal oxide comprising a third metal, and a fourth layer comprising a fourth metal oxide comprising a fourth metal different from the third metal; and a control circuit configured to control one or more voltages which are applied to the first conductive layer, the second conductive layer, and the third conductive layer, wherein the control circuit is configured to (i) start a first application of a first voltage between the first conductive layer and the third conductive layer, (ii) start a second application of the first voltage between the second conductive layer and the third conductive layer after a lapse of a first delay time since the start of the first application of the first voltage, in a state in which the first voltage is applied between the first conductive layer and the third conductive layer, and (iii) start an application of a second voltage, which is smaller than the first voltage, between the first conductive layer and the third conductive layer after a lapse of a second delay time since the start of the second application of the first voltage between the second conductive layer and the third conductive layer, in a state in which the first voltage is applied between the second conductive layer and the third conductive layer.

2. The memory device according to claim 1, wherein
the first voltage and the second voltage have a same polarity, and the second voltage is greater in magnitude than about half of a magnitude of the first voltage.

3. The memory device according to claim 1, wherein the first delay time is about 100 nanoseconds or more.

4. The memory device according to claim 1, wherein a sum of the first delay time and the second delay time is equal to a duration that is about ten times as long, or more, than the first delay time.

5. The memory device according to claim 1, wherein a sum of the first delay time and the second delay time is equal to a duration of about 10 microseconds or more.

6. The memory device according to claim 1, wherein the control circuit is configured to control the first delay time based on an amount of a current which flows through the third conductive layer.

7. The memory device according to claim 1, wherein the control circuit is configured to compare an amount of a current which flows through the third conductive layer with a reference value and is configured to control the first delay time based on a result of the comparison.

8. The memory device according to claim 1, wherein the second metal and the fourth metal are each at least one element selected from the group consisting of titanium, niobium, tantalum, and tungsten.

9. The memory device according to claim 1, wherein the first semiconductor and the second semiconductor are each silicon or germanium, the first semiconductor oxide and the second semiconductor oxide are each a silicon oxide or a germanium oxide, and the first metal and the third metal are each at least one element selected from the group consisting of aluminum, hafnium, and zirconium.

10. The memory device according to claim 1, wherein a resistivity of the first layer and the third layer is higher than a resistivity of the second layer and the fourth layer.

11. A control method of a memory device, comprising:
providing the memory device that includes a first conductive layer that extends in a first direction, a second conductive layer that extends in the first direction, a third conductive layer that extends in a second direction intersecting the first direction, a first variable resistance layer that is provided between the first conductive layer and the third conductive layer and comprises a first layer comprising a first semiconductor, a first semiconductor oxide, or a first metal oxide comprising a first metal, and a second layer comprising a second metal oxide comprising a second metal different from the first metal, and a second variable resistance layer that is provided between the second conductive layer and the third conductive layer and comprises a third layer including a second semiconductor, a second semiconductor oxide, or a third metal oxide comprising a third metal, and a fourth layer comprising a fourth metal oxide comprising a fourth metal different from the third metal;

starting a first application of a first voltage between the first conductive layer and the third conductive layer;

starting a second application of the first voltage between the second conductive layer and the third conductive layer after a lapse of a first delay time since the start of the first application of the first voltage, in a state in which the first voltage is applied between the first conductive layer and the third conductive layer; and starting an application of a second voltage, which is smaller than the first voltage, between the first conductive layer and the third conductive layer after a lapse of a second delay time after the start of the second application of the first voltage between the second conductive layer and the third conductive layer, in a state in which the first voltage is applied between the second conductive layer and the third conductive layer.

12. The control method of the memory device according to claim 11, wherein
the first voltage and the second voltage have a same polarity, and the second voltage is greater in magnitude than about half of a magnitude of the first voltage.

13. The control method of the memory device according to claim 11, wherein
the first delay time is about 100 nanoseconds or more.

14. The control method of the memory device according to claim 11, wherein
a sum of the first delay time and the second delay time is equal to a duration that is about ten times as long, or more, than the first delay time.

15. The control method of the memory device according to claim 11, wherein
a sum of the first delay time and the second delay time is equal to a duration of about 10 microseconds or more.

16. The control method of the memory device according to claim 11, comprising controlling the first delay time based on an amount of a current which flows through the third conductive layer.

17. The control method of the memory device according to claim 11, comprising comparing an amount of a current which flows through the third conductive layer with a reference value and controlling the first delay time based on a result of the comparison.

18. The control method of the memory device according to claim 11, wherein
the second metal and the fourth metal are each at least one element selected from the group consisting of titanium, niobium, tantalum, and tungsten.

19. The control method of the memory device according to claim 11, wherein
the first semiconductor and the second semiconductor are each silicon or germanium, the first semiconductor oxide and the second semiconductor oxide are each a silicon oxide or a germanium oxide, and the first metal and the third metal are each at least one element selected from the group consisting of aluminum, hafnium, and zirconium.

20. The control method of the memory device according to claim 11, wherein
a resistivity of the first layer and the third layer is higher than a resistivity of the second layer and the fourth layer.

\* \* \* \* \*